(12) United States Patent
Bailey et al.

(10) Patent No.: US 7,083,898 B1
(45) Date of Patent: Aug. 1, 2006

(54) METHOD FOR PERFORMING CHEMICAL SHRINK PROCESS OVER BARC (BOTTOM ANTI-REFLECTIVE COATING)

(75) Inventors: Todd C. Bailey, Fishkill, NY (US); Colin J. Brodsky, Salt Point, NY (US); Allen H. Gabor, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/160,744

(22) Filed: Jul. 7, 2005

(51) Int. Cl.
*G03F 7/00* (2006.01)
*H01L 21/00* (2006.01)

(52) U.S. Cl. .................. 430/314; 438/702; 438/703
(58) Field of Classification Search ............. 430/314; 438/702, 703
See application file for complete search history.

(56) References Cited

U.S. PATENT DOCUMENTS 4,707,218 A * 11/1987 Giammarco et al. ........ 438/421
6,740,473 B1 * 5/2004 Lin et al. ................... 430/315
2005/0130067 A1 * 6/2005 Endo et al. ................. 430/311

OTHER PUBLICATIONS

Kanda et al., "Advanced Microlithography Process with Chemical Shrink Technology", Advances in resist Technology and Processing XVII, proceedings of SPIE vol. 3999 (2000) pp. 881-889.*

* cited by examiner

*Primary Examiner*—Evan Pert
(74) *Attorney, Agent, or Firm*—Schmeiser, Olsen & Watts; Steven Capella

(57) ABSTRACT

A structure and a method for forming the same. The method includes providing a structure including (a) a hole layer, and (b) a pattern transfer layer on and in direct physical contact with the hole layer, wherein the pattern transfer layer comprises a pattern transfer layer hole; depositing an acid supply layer on a side wall of the pattern transfer layer hole; transferring acids from the acid supply layer to an acid storage region in the pattern transfer layer abutting the side wall of the pattern transfer layer hole after said depositing is performed; removing the acid supply layer after said transferring is performed; and performing a chemical shrinking process to the pattern transfer layer hole utilizing the acids from the acid storage region after said removing is performed so as to shrink the pattern transfer layer hole.

20 Claims, 7 Drawing Sheets

METHOD FOR PERFORMING CHEMICAL SHRINK PROCESS OVER BARC (BOTTOM ANTI-REFLECTIVE COATING)

TECHNICAL FIELD

The present invention relates to lithographic chemical shrink processes, and more specifically, to improvements to lithographic chemical shrink processes.

RELATED ART

During the fabrication of a semiconductor integrated circuit (IC), contact holes (i.e., openings) are typically formed in a dielectric layer and then filled with metal (e.g., copper) to provide electric accesses to devices of the IC underneath the dielectric layer. In one conventional method, these contact holes can be formed using a traditional photolithographic process. As the contact holes become smaller and smaller in size with, for example, successive technology generations, there is a need for improvements to the traditional photolithographic process for printing (i.e., creating) smaller contact holes.

SUMMARY OF THE INVENTION

The present invention provides a structure formation method, comprising providing a structure including (a) a hole layer, and (b) a pattern transfer layer on and in direct physical contact with the hole layer, wherein the pattern transfer layer comprises a pattern transfer layer hole such that a top hole layer surface of the hole layer is exposed to a surrounding ambient through the pattern transfer layer hole; depositing an acid supply layer on a side wall of the pattern transfer layer hole; transferring acids from the acid supply layer to an acid storage region in the pattern transfer layer abutting the side wall of the pattern transfer layer hole after said depositing is performed; removing the acid supply layer after said transferring is performed; and performing a chemical shrinking process to the pattern transfer layer hole utilizing the acids from the acid storage region after said removing is performed so as to shrink the pattern transfer layer hole.

The present invention also provides a structure formation method, comprising providing a structure including (a) a hole layer, and (b) a pattern transfer layer on and in direct physical contact with the hole layer, wherein the pattern transfer layer comprises a pattern transfer layer hole such that a top hole layer surface of the hole layer is exposed to a surrounding ambient through the pattern transfer layer hole; depositing an acid storage film on a side wall of the pattern transfer layer hole but essentially not on the exposed-to-ambient top hole layer surface; and performing a chemical shrinking process to the pattern transfer layer hole utilizing the acids from the acid storage film after said depositing is performed so as to shrink the pattern transfer layer hole.

The present invention also provides a structure, comprising (a) a hole layer, and (b) a pattern transfer layer on and in direct physical contact with the hole layer, wherein the pattern transfer layer comprises a pattern transfer layer hole, and wherein the pattern transfer layer comprises a first material; (c) an acid storage film being (i) on a side wall of the pattern transfer layer hole and (ii) in direct physical contact with the hole layer, wherein the acid storage film comprises a second material different from the first material; and (d) a polymerized hole shrinking region in direct physical contact with the hole layer and the acid storage film, wherein the polymerized hole shrinking region comprises a third material different from the second material, and wherein the acid storage film is sandwiched between and physically isolates the pattern transfer layer and the polymerized hole shrinking region.

The present invention provides improvements to the traditional photolithographic process for printing (i.e., creating) smaller contact holes.

DETAILED DESCRIPTION OF THE INVENTION

Figure 1A:
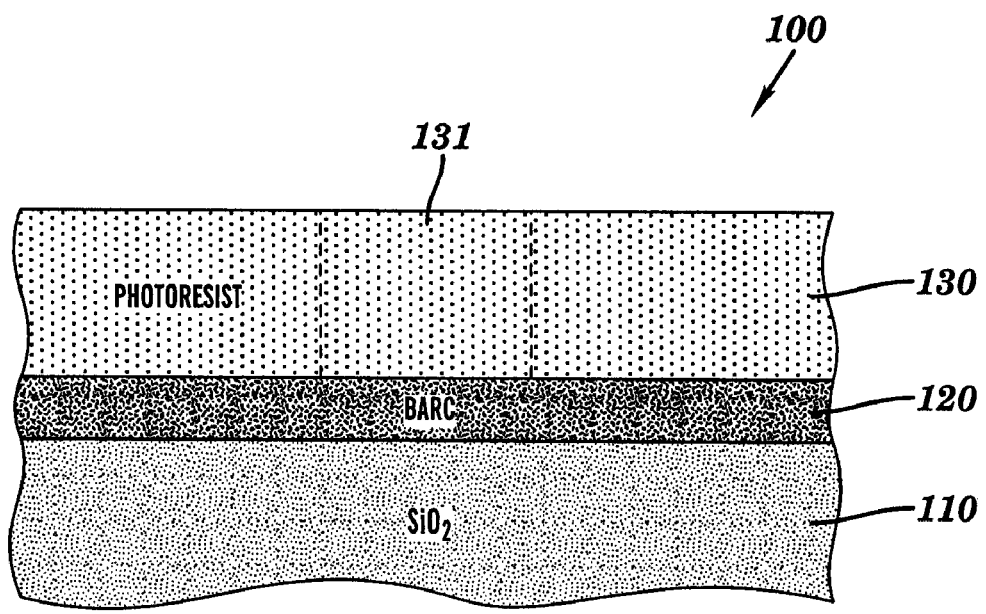
FIGS. 1A–1G illustrate the steps of a first contact hole printing process, in accordance with embodiments of the present invention.
Figure 1B:
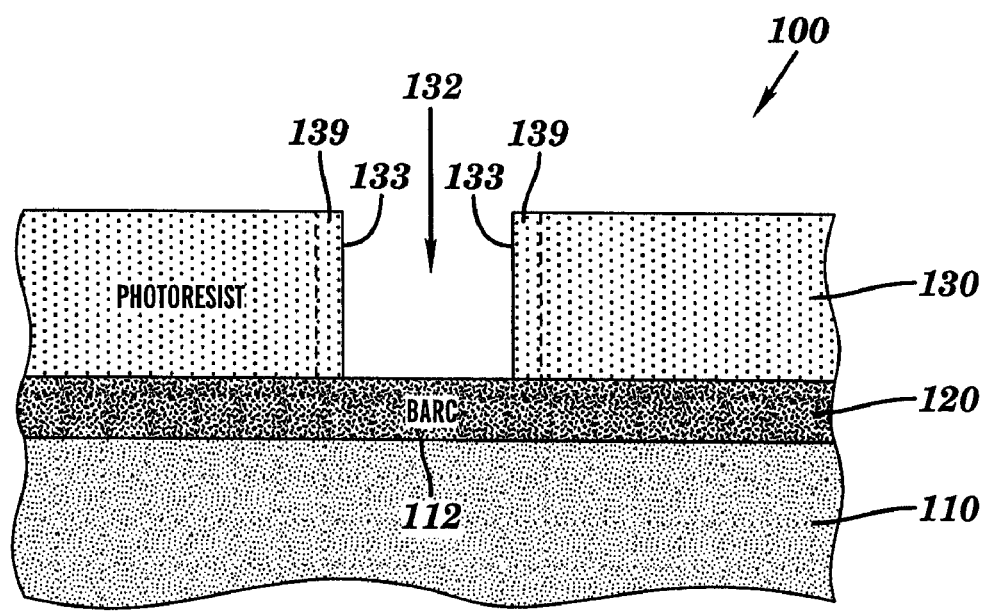

FIGS. 1A–1E show cross-section views of a structure 100 illustrating the steps of a first contact hole printing process, in accordance with embodiments of the present invention. More specifically, with reference to FIG. 1A, in one embodiment, the first contact hole printing process starts out with the structure 100 including a contact hole layer 110 (comprising a dielectric material such as $SiO_2$ in one embodiment) formed on a semiconductor substrate (not shown for simplicity). The structure 100 further comprises (i) a BARC (bottom antireflective coating) layer 120 on top of the contact hole layer 110 and (ii) a photoresist layer 130 on top of the BARC layer 120.

Next, in one embodiment, the photoresist layer 130 is exposed to light through a mask (not shown, but typically placed on top of the photoresist layer 130) containing clear and opaque features such that a region 131 of the photoresist layer 130 is exposed to light while other regions of the photoresist layer 130 are not exposed to light, in this case drawn to reflect a positive-tone photoresist. The BARC layer 120 optimizes the image quality by suppressing reflections within the photoresist layer 130. More specifically, the BARC layer 120 ensures that a substantial portion of light that passes through the photoresist layer 130 is absorbed by the BARC layer 120 without being reflected back to the photoresist layer 130 by any layer(s) beneath the BARC layer 120 (including the contact hole layer 110).

In one embodiment, assume that positive-tone optical lithography is used. In other words, the photoresist layer 130 comprises a positive-tone photoresist material such that regions of the photoresist layer 130 exposed to light change from originally insoluble to soluble in a photoresist developer (a solvent) while other regions of the photoresist layer 130 not exposed to light remain insoluble in the photoresist developer. As a result, with reference to FIG. 1B, in one embodiment, the photoresist developer is used to develop away (remove) the exposed-to-light region 131 (FIG. 1A) of the photoresist layer 130 (called development process) resulting in a photoresist hole 132 in the photoresist layer 130.

It should be noted that when the photoresist layer 130 is exposed to light, the intensity of energy reaching the photoresist layer 130 is at its highest at the center of the region 131 (FIG. 1A) and decays at the perimeter of the region 131 (FIG. 1A). As a result, a region 139 abutting the region 131 (FIG. 1A) does not attain an acid concentration level required for inducing photoresist development. Therefore, when the region 131 (FIG. 1A) is later removed, the region 139 remains and contains some photo acids (called residual photo acids).

Figure 1C:
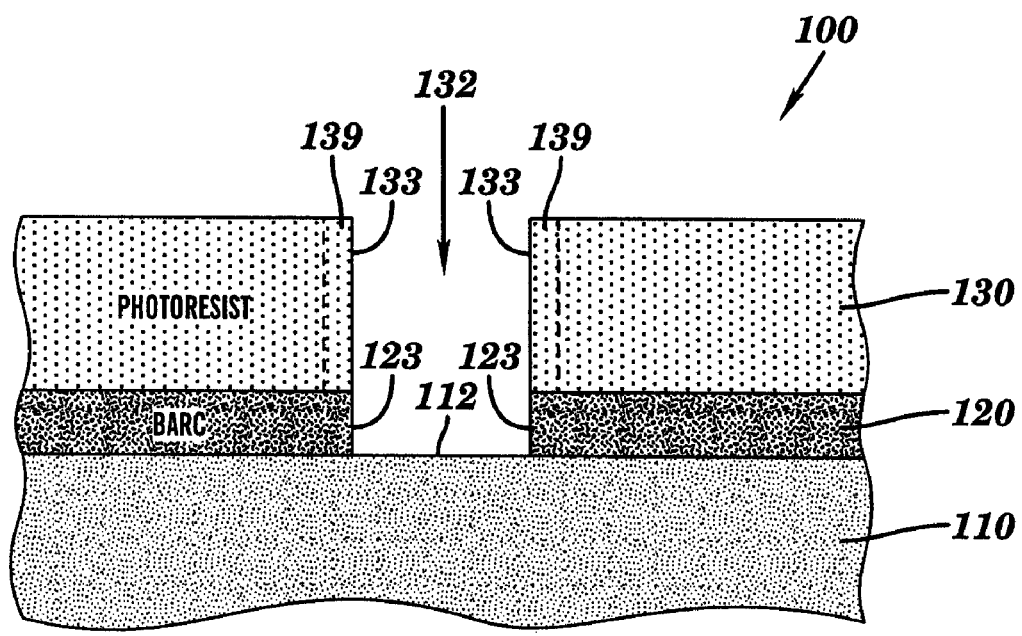

Next, in one embodiment, the patterned photoresist layer 130 is used as a blocking mask for directionally (vertically) etching the BARC layer 120 through the photoresist hole 132 so as to extend the photoresist hole 132 further down until a top surface 112 of the SiO$_2$ contact hole layer 110 is exposed to the surrounding ambient through the extended photoresist hole 132 as shown in FIG. 1C. As a result, the extended photoresist hole 132 has a side wall 133,123 comprising the photoresist side wall portion 133 and a BARC side wall portion 123. In one embodiment, the directional etching of the BARC layer 120 is a RIE (reactive ion etching) process.

Figure 1D:
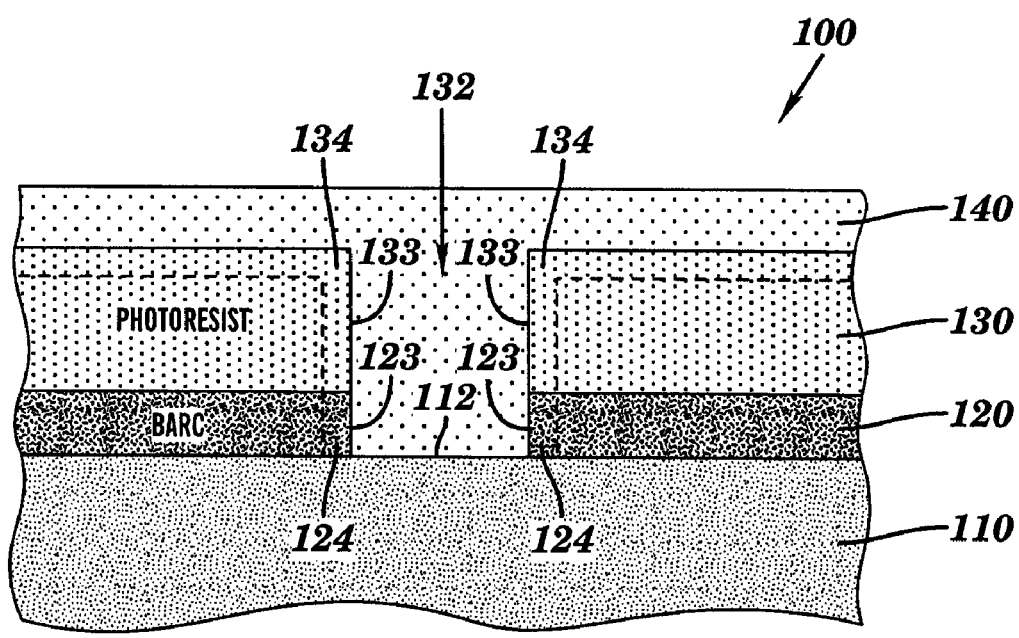

Next, with reference to FIG. 1D, in one embodiment, an acid supply layer 140 is deposited on top of the entire structure 100 of FIG. 1C (by spin-apply in one embodiment) such that the acid supply layer 140 is in direct physical contact with the photoresist side wall portion 133 and the BARC side wall portion 123 of the extended photoresist hole 132.

In one embodiment, the acid supply layer 140 comprises a material that contains acidic species (such as proton H+) that diffuse into regions 134 and 124 of the photoresist layer 130 and the BARC layer 120, respectively. Originally, acid concentrations in the regions 134 and 124 may be different. However, the acid diffusions from the acid supply layer 140 into the regions 134 and 124 tend to equalize the acid concentrations in the regions 134 and 124.

In one embodiment, the entire structure 100 of FIG. 1D is raised to a pre-determined temperature so as to speed up the acid diffusion process such that the acid concentrations in the regions 134 and 124 are essentially equal in a time period less than 60 seconds.

In one embodiment, the acid supply layer 140 comprises a weak water-based (or alcohol-based) solvent of a polymer which has an acid concentration high enough to allow for acid diffusion into the regions 134 and 124 but weak enough so as to not dissolve the photoresist layer 130 and the BARC layer 120.

Next, in one embodiment, the acid supply layer 140 is removed by, illustratively, a water rinsing step. As a result, the extended photoresist hole 132 is reopened and the top surface 112 of the contact hole layer 110 is again exposed to the surrounding ambient through the extended photoresist hole 132.

Figure 1E:
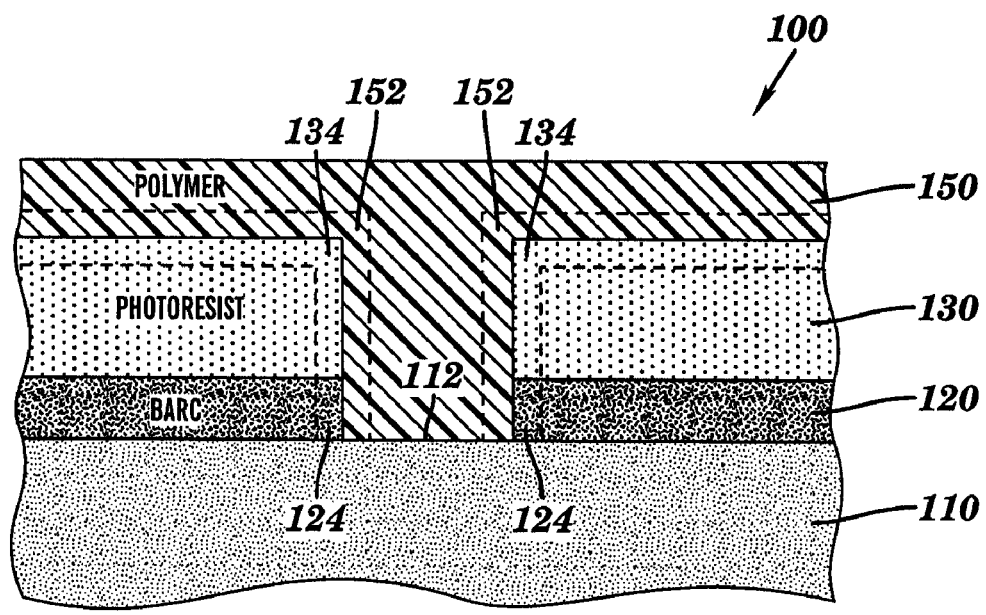

Next, with reference to FIG. 1E, in one embodiment, a hole shrinking film 150 is formed on top of the entire structure 100 by, illustratively, a spin-on process such that the hole shrinking film 150 comes into direct physical contact with the regions 134 and 124.

In one embodiment, the hole shrinking film 150 comprises a material which, when coming into direct contact with acids (like the acids in the regions 134 and 124) at an elevated temperature, becomes (i) insoluble in a first post-shrink rinse chemical (e.g., water) and (ii) capable of withstanding a subsequent etching of the contact hole layer 110 during the formation of a contact hole 114 (FIG. 1G) in the contact hole layer 110. More specifically, in one embodiment, the hole shrinking film 150 comprises a water-soluble (or alcohol-soluble) polymer and can be formed by spin-applying the water-soluble polymer on top of the entire structure 100.

Next, in one embodiment, the structure 100 is baked to an elevated temperature (i.e., higher than room temperature) such that the acids in the regions 134 and 124 diffuse into a hole shrinking region 152 of the hole shrinking film 150. At the elevated temperature, the diffused acids in the hole shrinking region 152 catalyze cross-linking reactions (i.e., polymerization) in the hole shrinking region 152 causing the hole shrinking region 152 to change from originally soluble to insoluble in the first post-shrink rinse chemical.

Figure 1F:
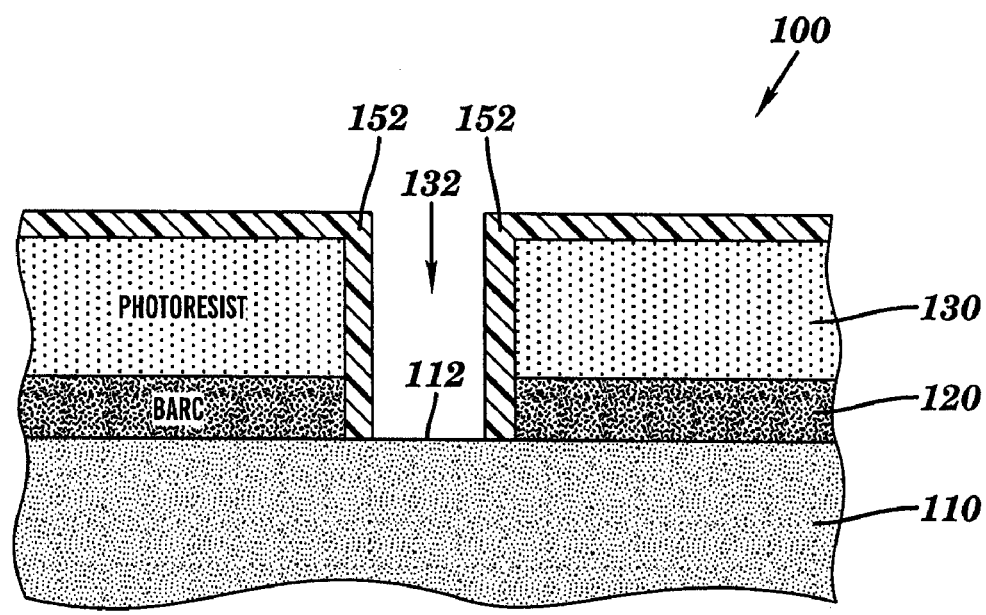

Next, the first post-shrink rinse chemical is used to the remove the entire hole shrinking film 150 except the insoluble hole shrinking region 152 such that the extended photoresist hole 132 is reopened (but shrunk) and such that the top surface 112 of the contact hole layer 110 is again exposed to the surrounding ambient through the shrunk photoresist hole 132 as shown in FIG. 1F. This process can be referred to as the first post-shrink rinse.

Figure 1G:
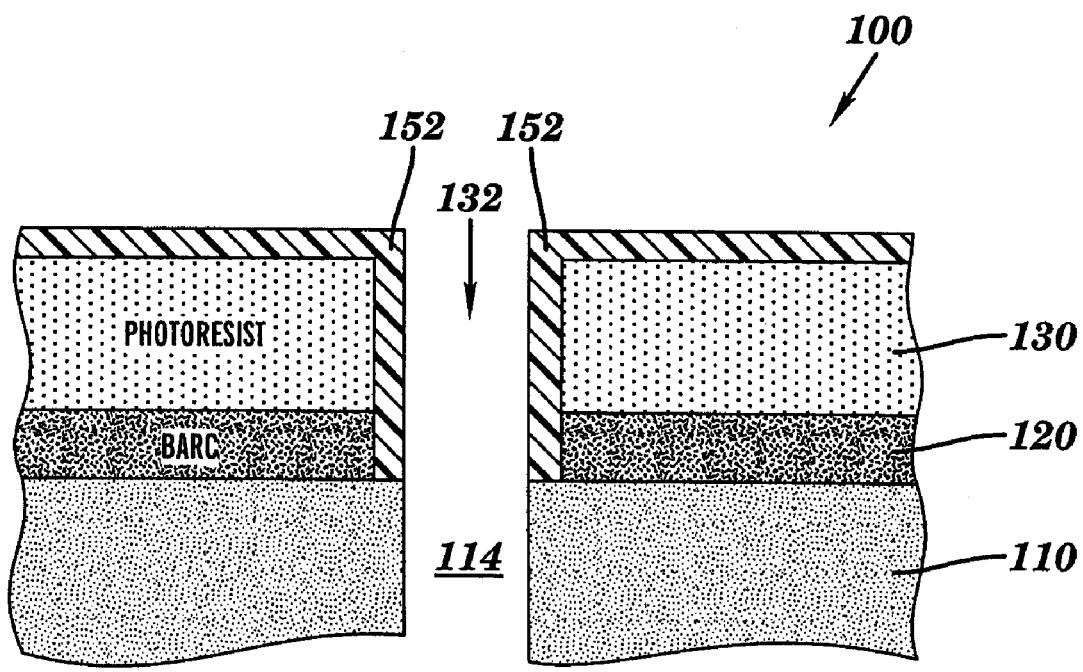

Next, with reference to FIG. 1G, in one embodiment, the contact hole 114 is formed in the contact hole layer 110 directly beneath and aligned with the shrunk photoresist hole 132. Illustratively, the contact hole 142 is formed by directionally etching (e.g., RIE in one embodiment) the contact hole layer 110 through the shrunk photoresist hole 132. In one embodiment, the contact hole 114 is then filled with an electrically conducting material (not shown) such as copper to provide electric access to device(s) (not shown) underneath the contact hole layer 110.

In summary, with reference to FIGS. 1A–1G, the first contact hole printing process comprises forming a pattern transfer layer 120,130 (i.e., the BARC layer 120 and the photoresist layer 130) on top of the contact hole layer 110 in which the contact hole 114 is to be printed. Next, a pattern transfer layer hole 132 (also called the photoresist hole 132) is formed in the pattern transfer layer 120,130. Next, the acid supply layer 140 is deposited to supply acids to the acid storage region 134,124 abutting the side wall 133,123 of the pattern transfer layer hole 132. Next, the acid supply layer 140 is removed. Next, a chemical shrink process is performed to the pattern transfer layer hole 132 utilizing the acids in the acid storage region 134,124 so as to shrink the pattern transfer layer hole 132. More specifically, the chemical shrink process comprises (i) depositing the hole shrinking film 150, (ii) polymerizing the hole shrinking region 152 of the hole shrinking film 150 utilizing the acids from the acid storage region 134,124, and (iii) removing the hole shrinking film 150 except the polymerized hole shrinking region 152 which in effect shrinks the pattern transfer layer hole 132. Finally, the contact hole 114 is formed in the contact hole layer 110 aligned with the shrunk pattern transfer layer hole 132.

FIGS. 2A–2E show cross-section views of a structure 200 illustrating the steps of a second contact hole printing process, in accordance with embodiments of the present invention. More specifically, with reference to FIG. 2A, in one embodiment, the second contact hole printing process starts out with the structure 200 similar to the structure 100 of FIG. 1B. For simplicity, all reference numerals herein have three numeric digits starting with the numeric figure number. In addition, similar regions have the identical reference numerals except for the first digit which is used to indicate the numeric figure number.

More specifically, the structure 200 comprises a contact hole layer 210 (comprising a dielectric material such as SiO$_2$ in one embodiment) formed on a semiconductor substrate (not shown for simplicity). The structure 200 further comprises (i) a BARC (bottom antireflective coating) layer 220 on top of the contact hole layer 210 and (ii) a photoresist layer 230 on top of the BARC layer 220. The photoresist layer 230 and the BARC layer 220 comprise a photoresist hole 232 such that a top surface 212 of the SiO$_2$ contact hole layer 210 is exposed to the surrounding ambient through the photoresist hole 232.

Figure 2A:
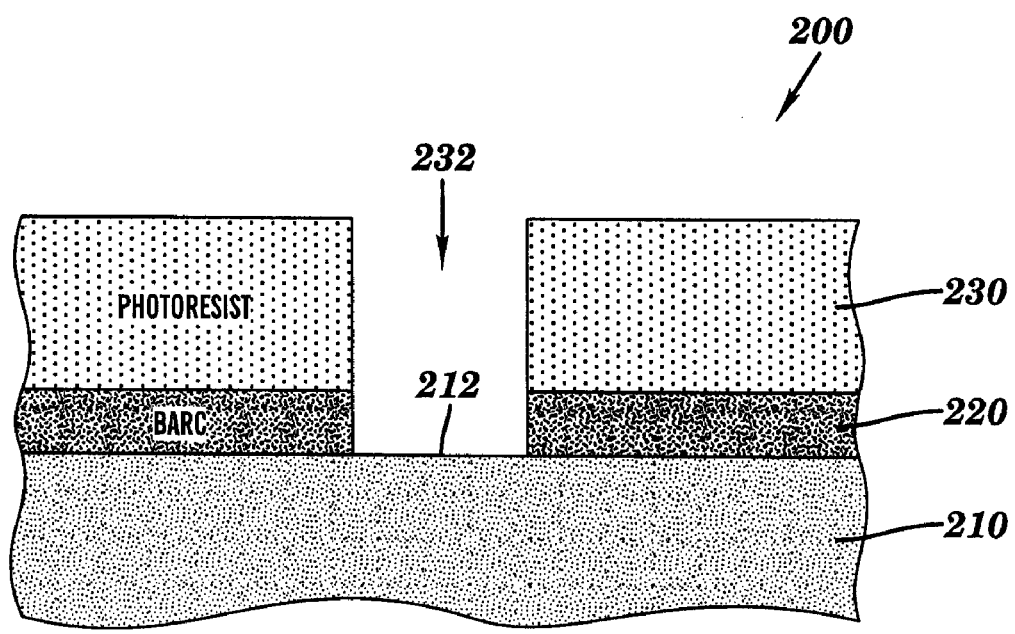
FIGS. 2A–2E illustrate the steps of a second contact hole printing process, in accordance with embodiments of the present invention.
Figure 2B:
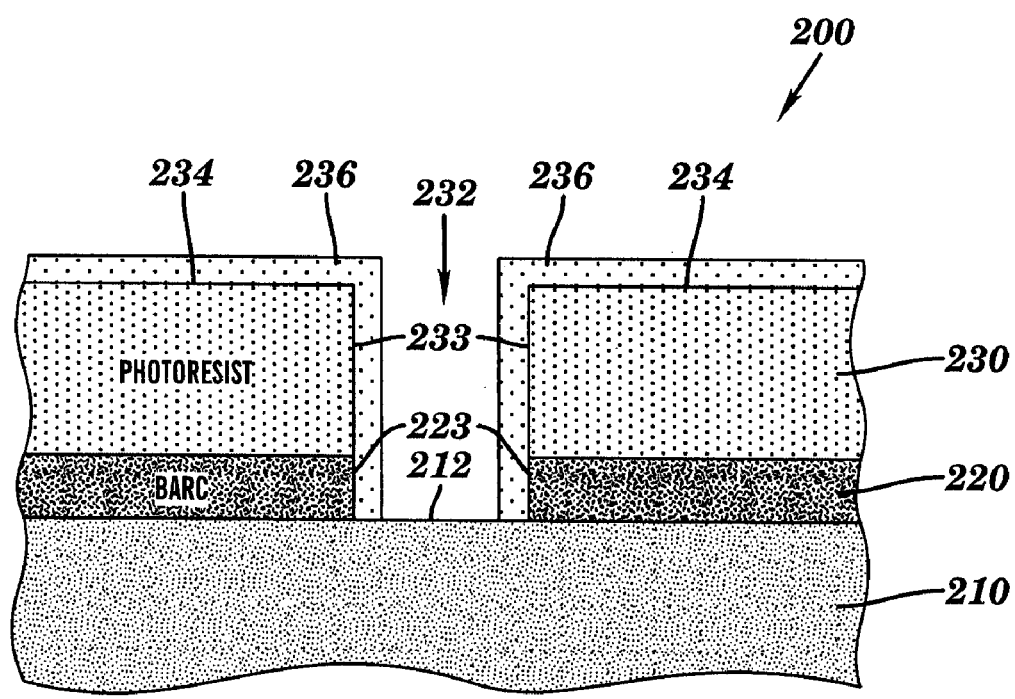

Next, with reference to FIG. 2B, in one embodiment, an acid storage film 236 is conformably formed (by chemical vapor deposition or CVD in one embodiment) on all organic surfaces that are exposed to the surrounding ambient but essentially not on non-organic surfaces of the structure 200 of FIG. 2A. The organic surfaces include (i) a top surface 234 of the photoresist layer 230 and (ii) a side wall 233,223 of the photoresist hole 232. The side wall 233,223 comprises a photoresist side wall portion 233 and a BARC side wall portion 223.

In one embodiment, the acid storage film 236 comprises a material that contains acids that are needed for a subsequent chemical shrinking process (described below). In addition, the material of the acid storage film 236 also contains functional units that chemically react with acrylic or other polymer functional groups present on organic surfaces but not present on non-organic surfaces so as to form durable bonds only between the acid storage film 236 and these organic surfaces.

Figure 2C:
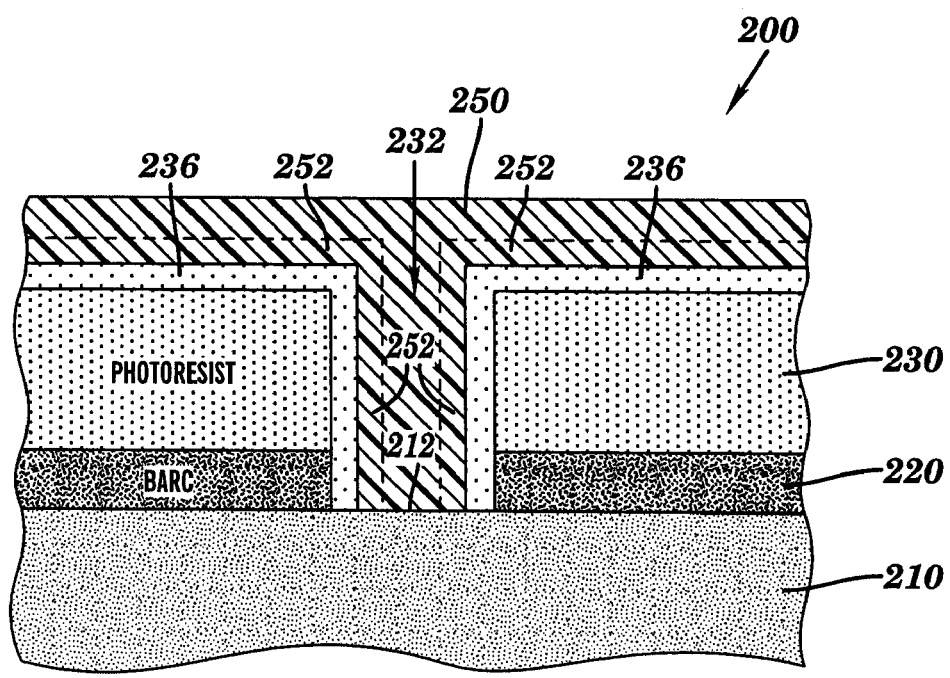

Next, with reference to FIG. 2C, in one embodiment, a hole shrinking film 250 is formed on top of the entire structure 200 of FIG. 2B by, illustratively, a spin-on process such that the hole shrinking film 250 completely fills the photoresist hole 232.

In one embodiment, the hole shrinking film 250 comprises a material which, when coming into direct contact with acids (like the acids in the acid storage film 236) at an elevated temperature, becomes (i) insoluble in a second post-shrink rinse chemical (e.g., water) and (ii) capable of withstanding a subsequent etching of the contact hole layer 210 during the formation of a contact hole 214 (FIG. 2E) in the contact hole layer 210. More specifically, in one embodiment, the hole shrinking film 250 comprises a water-soluble (or alcohol-soluble) polymer and can be formed by spin-applying the water-soluble polymer on top of the entire structure 200 of FIG. 2B.

Next, the structure 200 is baked to an elevated temperature such that (i) the acids in the acid storage film 236 diffuse into a hole shrinking region 252 of the hole shrinking film 250. At the elevated temperature, the diffused acids in the hole shrinking region 252 catalyze cross-linking reactions (i.e., polymerization) in the hole shrinking region 252 causing the hole shrinking region 252 to change from originally soluble to insoluble in the second post-shrink rinse chemical.

Figure 2D:
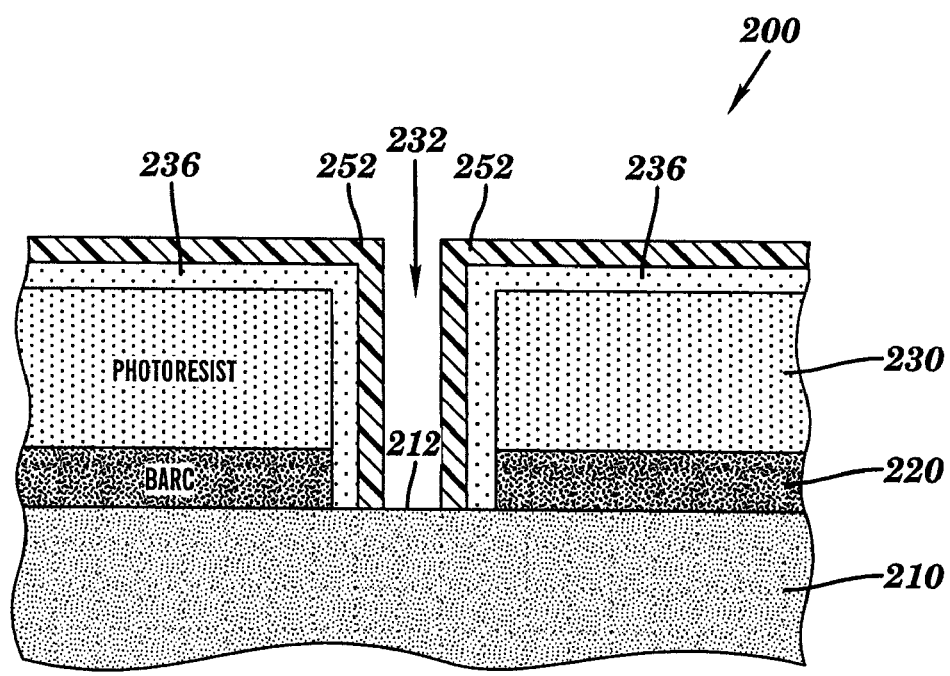

Next, the second post-shrink rinse chemical is used to develop away (i.e., remove) the entire hole shrinking film 250 except the insoluble hole shrinking region 252 such that the photoresist hole 232 is reopened (but shrunk) and such that the top surface 212 of the contact hole layer 210 is again exposed to the surrounding ambient through the shrunk photoresist hole 232 as shown in FIG. 2D. This process can be referred to as the second post-shrink rinse.

Figure 2E:
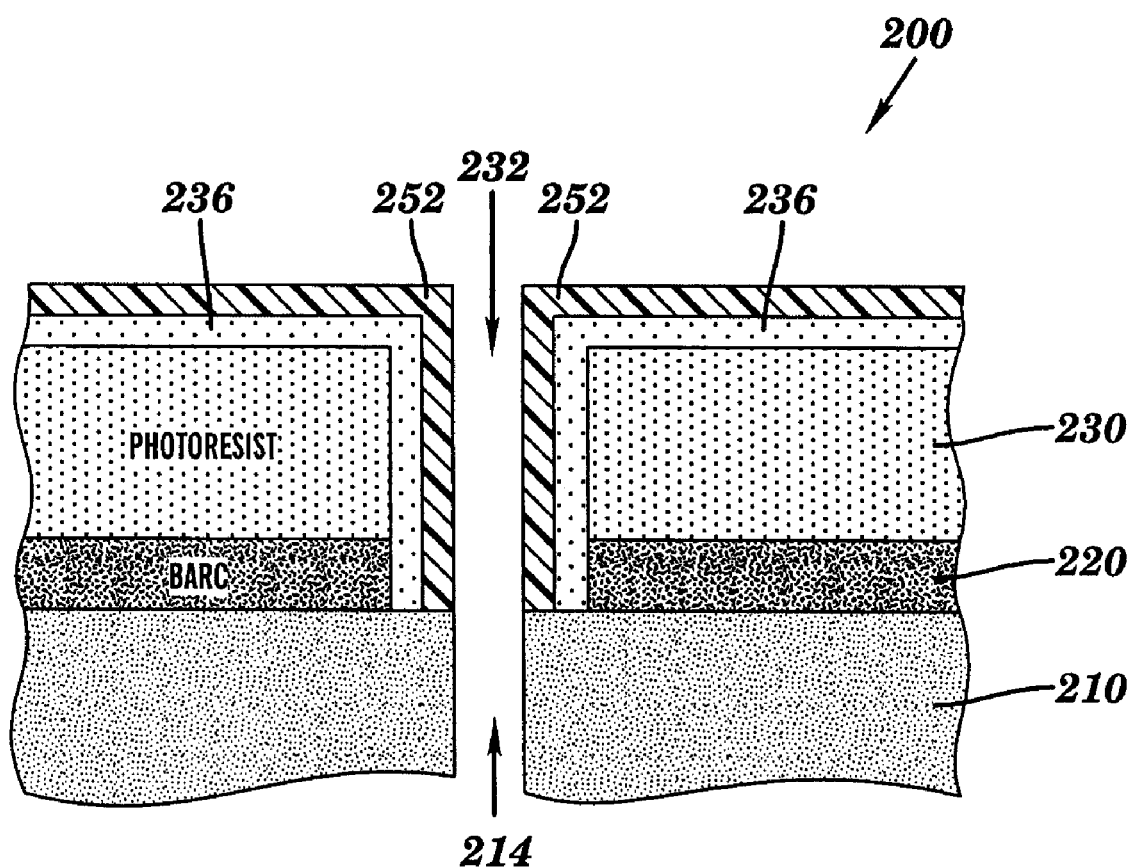

Next, with reference to FIG. 2E, in one embodiment, the contact hole 214 is formed in the contact hole layer 210 directly beneath and aligned with the shrunk photoresist hole 232. Illustratively, the contact hole 214 is formed by directionally etching (e.g., RIE in one embodiment) the contact hole layer 210 through the shrunk photoresist hole 232. In one embodiment, the contact hole 214 is then filled with an electrically conducting material (not shown) such as copper to provide electric access to device(s) (not shown) underneath the contact hole layer 210.

In summary, with reference to FIGS. 2A–2E, the second contact hole printing process comprises forming a pattern transfer layer 220,230 (i.e., the BARC layer 220 and the photoresist layer 230) on top of the contact hole layer 210 in which the contact hole 214 is to be printed (i.e., formed). Next, a pattern transfer layer hole 232 (also called the photoresist hole 232) is formed in the pattern transfer layer 220,230. Next, the acid storage film 236 is deposited to supply acids for a subsequent chemical shrink process. Next, the chemical shrink process is performed to the pattern transfer layer hole 232 utilizing the acids from the acid storage film 236 so as to shrink the pattern transfer layer hole 232. More specifically, the chemical shrink process comprises (i) depositing the hole shrinking film 250, (ii) polymerizing the hole shrinking region 252 of the hole shrinking film 250 with the help of the acids from the acid storage film 236, and (iii) removing the hole shrinking film 250 except the polymerized hole shrinking region 252 which in effect shrinks the pattern transfer layer hole 232. Finally, the contact hole 214 is formed in the contact hole layer 210 aligned with the shrunk pattern transfer layer hole 232.

In the embodiments described above, the first and contact hole printing processes are used to print contact holes 114 and 214 of FIGS. 1G and 2E, respectively. In general, any hole (not just contact holes) of any size and shape can be printed in the layers 110 and 210 of FIGS. 1G and 2E, using the first and second contact hole printing processes, respectively. For instance, with reference to FIGS. 1A–1G, if a the hole 114 having a shape of a long trench needs to be printed in the layer 110, the photoresist hole 132 needs to have the shape of a long trench.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A structure formation method, comprising:
    providing a structure including
    (a) a hole layer, and
    (b) a pattern transfer layer on and in direct physical contact with the hole layer, wherein the pattern transfer layer comprises a pattern transfer layer hole such that a top hole layer surface of the hole layer is exposed to a surrounding ambient through the pattern transfer layer hole;
    depositing an acid supply layer on a side wall of the pattern transfer layer hole;
    transferring acids from the acid supply layer to an acid storage region in the pattern transfer layer abutting the side wall of the pattern transfer layer hole after said depositing is performed;
    removing the acid supply layer after said transferring is performed; and
    performing a chemical shrinking process to the pattern transfer layer hole utilizing the acids from the acid storage region after said removing is performed so as to shrink the pattern transfer layer hole.

2. The method of claim 1, further comprising forming a hole in the hole layer aligned with the shrunk pattern transfer layer hole after said performing the chemical shrinking process is performed.

3. The method of claim 2, wherein said forming the hole comprises reactive ion etching (RIE) the hole layer through the shrunk pattern transfer layer hole.

4. The method of claim 1, wherein the pattern transfer layer comprises (i) a bottom antireflective coating (BARC) layer on the hole layer, and (ii) a photoresist layer on the BARC layer.

5. The method of claim 1, wherein said depositing the acid supply layer on the side wall of the pattern transfer layer hole comprises spin-applying the acid supply layer (i) on the side wall of the pattern transfer layer hole, (ii) on the top hole layer surface, and (iii) on a top pattern transfer layer surface of the pattern transfer layer.

6. The method of claim 1, wherein said transferring the acids comprises raising the structure to a pre-determined temperature such that acid diffusion from the acid supply layer into the acid storage region essentially equalizes acid concentrations through out the acid storage region in a time period of less than 60 seconds.

7. The method of claim 1, wherein said removing the acid supply layer comprises water-rinsing off the acid supply layer.

8. The method of claim 1, wherein said performing the chemical shrinking process comprises:
   depositing a hole shrinking film on the side wall of the pattern transfer layer hole after said removing the acid supply layer is performed;
   causing a hole shrinking region of the hole shrinking film abutting the acid storage region to be polymerized; and
   removing the hole shrinking film except the polymerized hole shrinking region such that an area of the top hole layer surface is exposed to the surrounding ambient via the pattern transfer layer hole.

9. The method of claim 8, wherein said depositing the hole shrinking film comprises spin-applying the hole shrinking film (i) on the side wall of the pattern transfer layer hole, (ii) on the top hole layer surface, and (iii) on a top pattern transfer layer surface of the pattern transfer layer.

10. The method of claim 8, wherein said causing the hole shrinking region to be polymerized comprises baking the structure to an elevated temperature higher than room temperature so as to (i) diffuse acids from the acid storage region into the hole shrinking region and (ii) cause the diffused acids in the hole shrinking region to catalyze polymerization in the hole shrinking region such that the hole shrinking region changes from originally soluble to insoluble in a post-shrink rinse chemical.

11. The method of claim 10, wherein said removing the hole shrinking film except the polymerized hole shrinking region comprises using the post-shrink rinse chemical to develop away the hole shrinking film except the polymerized hole shrinking region.

12. A structure formation method, comprising:
   providing a structure including:
   (a) a hole layer, and
   (b) a pattern transfer layer on and in direct physical contact with the hole layer, wherein the pattern transfer layer comprises a pattern transfer layer hole such that a top hole layer surface of the hole layer is exposed to a surrounding ambient through the pattern transfer layer hole;
   depositing an acid storage film on a side wall of the pattern transfer layer hole but essentially not on the exposed-to-ambient top hole layer surface; and
   performing a chemical shrinking process to the pattern transfer layer hole utilizing the acids from the acid storage film after said depositing is performed so as to shrink the pattern transfer layer hole.

13. The method of claim 12, further comprising forming a hole in the hole layer aligned with the shrunk pattern transfer layer hole after said performing the chemical shrinking process is performed.

14. The method of claim 13, wherein said forming the hole comprises reactive ion etching (RIE) the hole layer through the shrunk pattern transfer layer hole.

15. The method of claim 12, wherein the pattern transfer layer comprises (i) a bottom antireflective coating (BARC) layer on the hole layer, and (ii) a photoresist layer on the BARC layer.

16. The method of claim 12, wherein said depositing the acid storage film comprises depositing by chemical vapor deposition (CVD) the acid storage film (i) on the side wall of the pattern transfer layer hole and (ii) on a top pattern transfer layer surface of the pattern transfer layer, but essentially not on the exposed-to-ambient top hole layer surface.

17. A structure, comprising:
   (a) a hole layer, and
   (b) a pattern transfer layer on and in direct physical contact with the hole layer, wherein the pattern transfer layer comprises a pattern transfer layer hole, and
   wherein the pattern transfer layer comprises a first material;
   (c) an acid storage film being (i) on a side wall of the pattern transfer layer hole and (ii) in direct physical contact with the hole layer,
   wherein the acid storage film comprises a second material different from the first material; and
   (d) a polymerized hole shrinking region in direct physical contact with the hole layer and the acid storage film, wherein the polymerized hole shrinking region comprises a third material different from the second material, and
   wherein the acid storage film is sandwiched between and physically isolates the pattern transfer layer and the polymerized hole shrinking region.

18. The structure of claim 17, wherein the hole layer comprises a hole aligned with the pattern transfer layer hole.

19. The structure of claim 17, wherein the pattern transfer layer comprises (i) a bottom antireflective coating (BARC) layer on the hole layer, and (ii) a photoresist layer on the BARC layer, wherein the acid storage film is in direct physical contact with both the BARC layer and the photoresist layer.

20. The structure of claim 19, wherein the acid storage film and the BARC layer have a first common interfacing surface essentially perpendicular to a second common interfacing surface of the BARC layer and the hole layer.

* * * * *